(12) United States Patent
Denier

(10) Patent No.: US 7,786,777 B2
(45) Date of Patent: Aug. 31, 2010

(54) CIRCUIT ARRANGEMENT AND METHOD FOR THE PROVISION OF A CLOCK SIGNAL WITH AN ADJUSTABLE DUTY CYCLE

(75) Inventor: Urs Denier, Jona (CH)

(73) Assignee: Austriamicrosystems AG, Unterpremstätten (AT)

( * ) Notice: Subject to any disclaimer, the term of this patent is extended or adjusted under 35 U.S.C. 154(b) by 145 days.

(21) Appl. No.: 12/210,752

(22) Filed: Sep. 15, 2008

(65) Prior Publication Data
US 2009/0072873 A1    Mar. 19, 2009

Related U.S. Application Data

(63) Continuation of application No. PCT/EP2007/002209, filed on Mar. 13, 2007.

(30) Foreign Application Priority Data
Mar. 13, 2006   (DE)  ............... 10 2006 011 448

(51) Int. Cl.
H03K 5/01  (2006.01)
(52) U.S. Cl. .......................... 327/167; 327/291
(58) Field of Classification Search ................. 327/167, 327/291
See application file for complete search history.

(56) References Cited

U.S. PATENT DOCUMENTS

| | | |
|---|---|---|
| 3,805,192 A | 4/1974 | Ocnaschek et al. |
| 4,479,216 A | 10/1984 | Krambeck et al. |
| 4,959,557 A | 9/1990 | Miller |
| 5,481,228 A | 1/1996 | Badyal |
| 6,169,765 B1 | 1/2001 | Holcombe |

(Continued)

FOREIGN PATENT DOCUMENTS

DE     31 12 035     2/1982

(Continued)

OTHER PUBLICATIONS

"Produire un rapport cyclique de 50% précis a 20 MHZ", Electronique, CEP Communication, Paris, FR, No. 90, pp. 88, 90, XP000894138, ISSN: 1157-1152, Mar. 1999.

(Continued)

Primary Examiner—Lincoln Donovan
Assistant Examiner—John W Poos
(74) Attorney, Agent, or Firm—Cohen Pontani Lieberman & Pavane LLP

(57) ABSTRACT

The circuit arrangement (1) comprises an input (2) for the connection of an oscillator (3) and an amplifier circuit (20) having a first input (21) that is coupled to the input (1) of the circuit arrangement (1), having a second input (22) and an output (23) that is connected to an output (4) of the circuit arrangement (1). A clock signal (Vout) with a duty cycle ($\phi$) can be accessed at the output (4) of the circuit arrangement (1). The circuit arrangement (1) furthermore incorporates a low-pass filter (40), the input of which is connected to the output (23) of the amplifier circuit (20), and an integrator circuit (50) the input of which is connected to the low-pass filter (40) and the output of which is connected to the second input (22) of the amplifier circuit (20) for the delivery of an adjustable threshold value (Vth) for controlling the duty cycle ($\phi$).

20 Claims, 8 Drawing Sheets

U.S. PATENT DOCUMENTS

Figure 1:
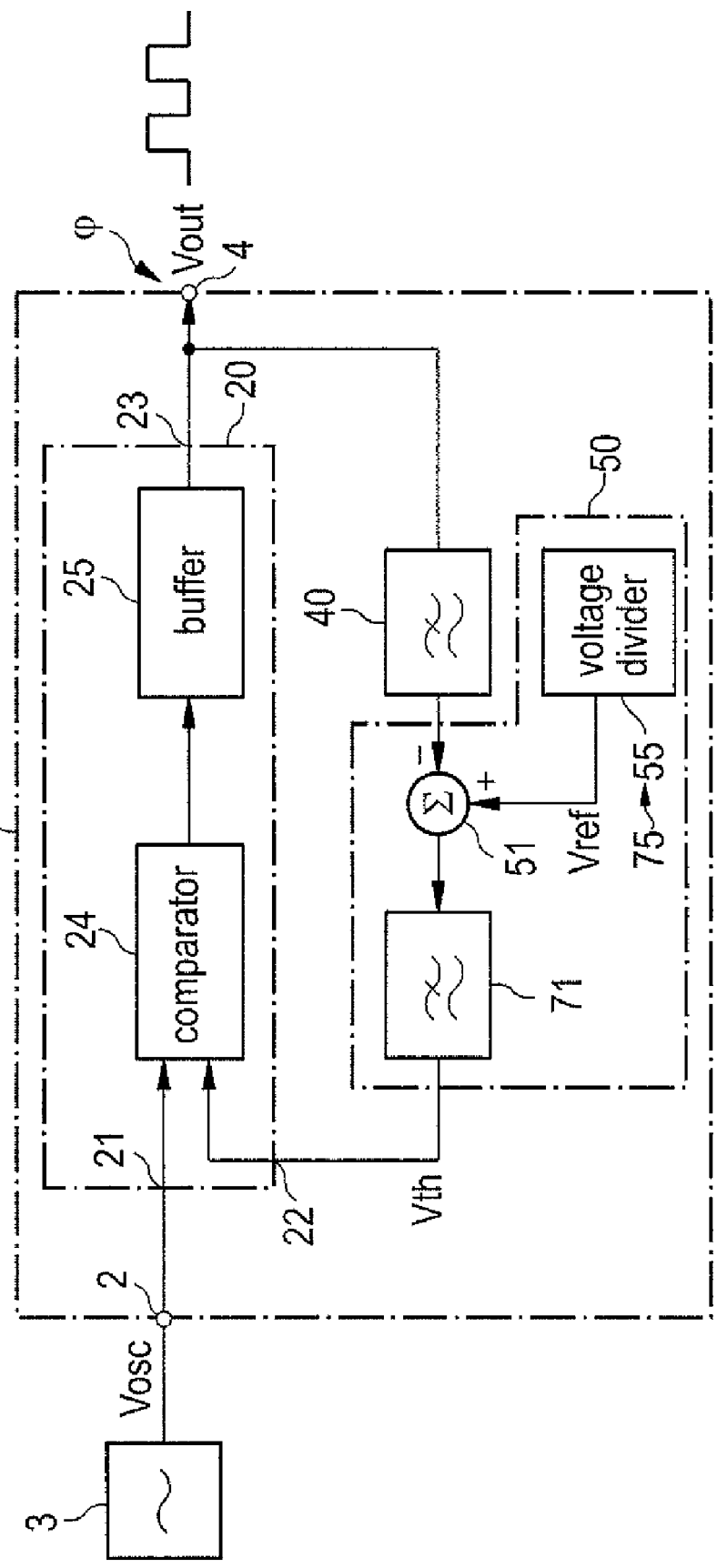

| | | |
|---|---|---|
| 6,320,438 B1 | 11/2001 | Arcus |
| 2005/0231133 A1 | 10/2005 | Lys |

FOREIGN PATENT DOCUMENTS

| | | |
|---|---|---|
| DE | 198 22 374 | 8/1999 |
| EP | 0 155 041 | 2/1985 |
| GB | 1 505 088 | 3/1978 |
| JP | 59-8112 | 1/1984 |
| WO | WO 99/56385 | 11/1999 |

OTHER PUBLICATIONS

C.C. Enz, "A CMOS Chopper Amplifier", IEEE Journal of Solid-State Circuits, vol. SC-22, No. 3, Jun. 1987.

E. Vittoz et al., "High-Performance Crystal Oscillator Circuits: Theory and Application", IEEE Journal of Solid-State Circuits, vol. 23, No. 3, pp. 774-783, Jun. 1988.

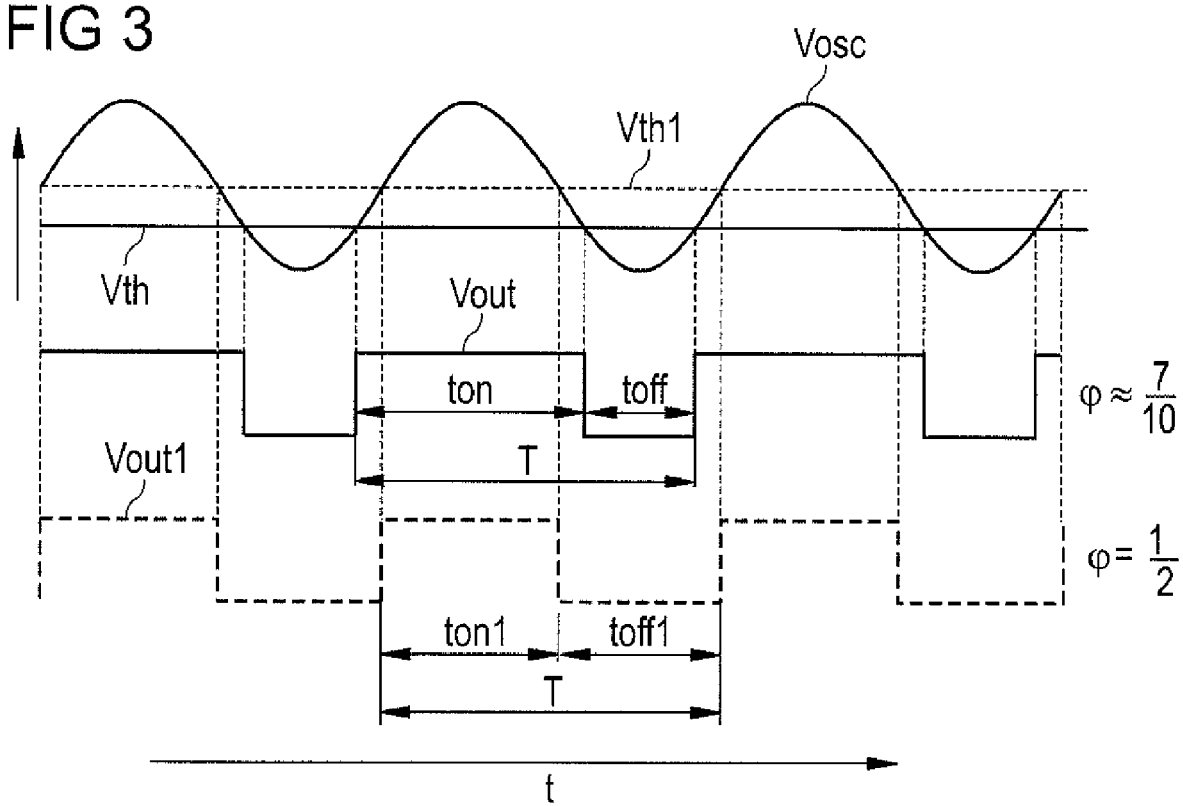

FIG 7A
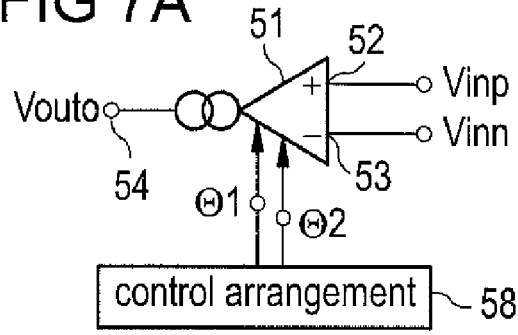
FIG 7B
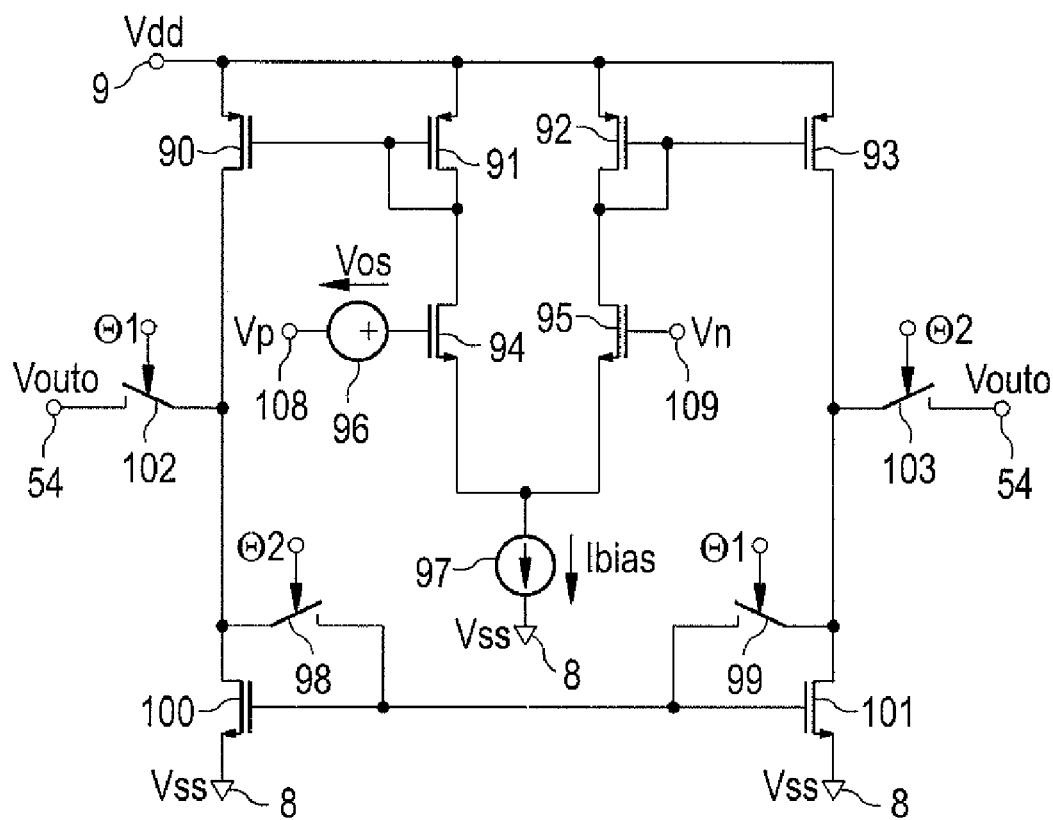
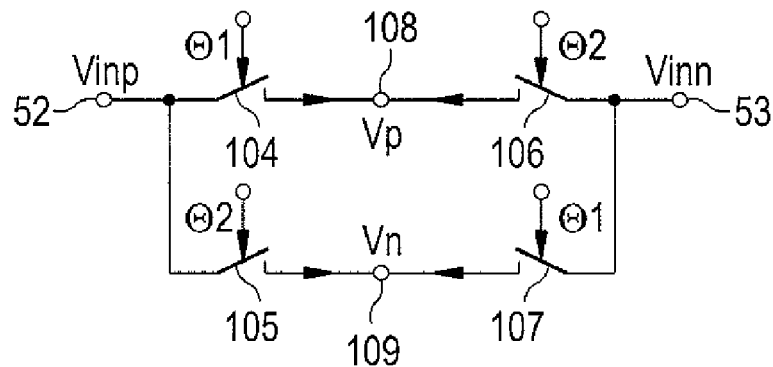

CIRCUIT ARRANGEMENT AND METHOD FOR THE PROVISION OF A CLOCK SIGNAL WITH AN ADJUSTABLE DUTY CYCLE

RELATED APPLICATIONS

This is a continuation of International Application No. PCT/EP2007/002209, filed on Mar. 13, 2007, which claims priority from German Patent Application No. 10 2006 011 448.5, filed on Mar. 13, 2006, the content of which is hereby incorporated by reference.

FIELD OF THE INVENTION

The present invention concerns a circuit arrangement for the provision of a clock signal with an adjustable duty cycle, its use, and a method for providing a clock signal with an adjustable duty cycle.

BACKGROUND OF THE INVENTION

Oscillators, particularly quartz oscillators, are circuits that are used widely to provide a clock signal for microprocessors and memory components. An accurate duty cycle is often required here. The duty cycle of a clock signal is usually defined as the ratio between the time during which the clock signal is at a "high" level to the period of the full clock signal.

The document "High-Performance Crystal Oscillator Circuits: Theory and Application" by E. Vittoz, M. Degrauwe, and S. Bitz in the IEEE Journal of Solid-State Circuits, Volume 23, Number 3, June 1988, pp. 774 to 783 describes an equivalent circuit for an oscillator quartz and a quartz oscillator circuit.

Document U.S. Pat. No. 4,959,557 concerns a circuit with a feed-forward and a feedback branch for controlling the duty cycle of a clock signal.

Document U.S. Pat. No. 5,481,228 describes an arrangement for controlling the duty cycle using transistor stages connected in series.

SUMMARY OF THE INVENTION

An object of the present invention is to provide a circuit arrangement and a method for providing a clock signal that permits accurate control of the duty cycle of the clock signal.

This and other objects are attained in accordance with one aspect of the present invention directed to a circuit arrangement for the provision of a clock signal with an adjustable duty cycle, comprising an input for connecting an oscillator. An amplifier circuit has a first input that is coupled to the input of the circuit arrangement, a second input, a comparator whose inputs constitute the first and second input of the amplifier circuit, and a buffer that comprises at least a first inverter and couples an output of the comparator to an output of the amplifier circuit. The circuit arrangement further comprises an output which is connected to the output of the amplifier circuit and at which a clock signal with a duty cycle is available; a low-pass filter, an input of which is connected to the output of the amplifier circuit; and an integrator circuit, an input of which is connected to the low-pass filter and an output of which is connected to the second input of the amplifier circuit for the provision of an adjustable threshold value for controlling the duty cycle (f). The integrator circuit comprises a loop filter that is connected to the output of the integrator circuit. The loop filter comprises a first capacitor that connects the output of the integrator circuit to the ground potential terminal and a series circuit comprising a resistor and a second capacitor that connect the output of the integrator circuit to the ground potential terminal.

Another aspect of the invention is directed to a method for providing a clock signal with an adjustable duty cycle, comprising the steps of supplying an oscillator signal, comparing the oscillator signal with a threshold value, amplifying the result of the comparison and providing the amplified result of the comparison as the clock signal with the duty cycle, providing a signal derived from the duty cycle, comparing the signal derived from the duty cycle with an adjustable reference voltage and providing the threshold value in accordance with the result of the comparison, wherein an integrator circuit comprises a transconductance amplifier and a loop filter, the integrator circuit provides at its output the threshold value depending on a current at an output of the transconductance amplifier and on a filter characteristic of the loop filter, and where the loop filter comprises a first capacitor that is connected in parallel to a series circuit comprising a second capacitor and a first resistor between the output of the transconductance amplifier and a ground potential terminal.

A circuit arrangement according to an embodiment of the invention for the provision of a clock signal with an adjustable duty cycle comprises an amplifier circuit, a low-pass filter and an integrator circuit. A first input of the amplifier circuit is connected to an input of the circuit arrangement. An output of the amplifier circuit is coupled to an output of the circuit arrangement. The input of the low-pass filter is connected to the output of the amplifier circuit, while its output is connected to the integrator circuit. The output of the integrator circuit, in turn, is connected to a second input of the amplifier circuit.

The input of the circuit arrangement is used to connect an oscillator. An oscillator voltage is fed to the input of the circuit arrangement. A clock signal with a duty cycle can be accessed at the output of the circuit arrangement. A signal present at the output of the amplifier circuit is supplied to the low-pass filter. A signal that can be accessed at the output of the low-pass filter is supplied to the integrator circuit. The integrator circuit is designed to deliver a specifiable threshold value for controlling the duty cycle. This threshold value is fed to the second input of the amplifier circuit. The amplifier circuit provides a signal at its output whose value depends on the oscillator signal and on the threshold value.

The signal generated by the amplifier circuit is thus fed back through the low-pass filter and the integrator circuit to the second input of the amplifier circuit. The low-pass filter generates a signal that, to a first approximation, has a constant value that corresponds to the duty cycle. Due to the feedback, any change in the duty cycle arising, for instance, as a result of a disturbance in the oscillator voltage or of an electrical load that might be coupled to the output is counteracted, so that the duty cycle prior to the interference is again achieved.

A threshold value of the amplifier circuit can be adjusted by means of the threshold value generated by the integrator circuit. An advantage of the circuit arrangement is that a phase of the clock signal is almost identical to a phase of the oscillator signal.

In a further development, the amplifier circuit incorporates a comparator, a first and a second input of which are connected respectively to the first and second inputs of the amplifier circuit. An output of the comparator can be connected to the output of the amplifier circuit. A buffer can be provided to connect the output of the comparator to the output of the amplifier circuit.

In an alternative further development, the amplifier circuit incorporates a buffer with an output that is connected by means of a coupling capacitor to the first input of the amplifier circuit. At its input, the buffer, furthermore is connected to the second input of the amplifier circuit, while its output is connected to the output of the amplifier circuit.

The buffer can incorporate an inverter. Alternatively, the buffer can comprise a first inverter and a second inverter, whereby the second inverter follows the first inverter. The output current that can be drawn from the second inverter here can be larger than the output current of the first inverter. In one embodiment of this further development, the width-to-length ratio of the p-channel field-effect transistor in the second inverter can be larger than the width-to-length ratio of the p-channel field effect transistor of the first inverter and, correspondingly, a width-to-length ratio of the n-channel field-effect transistor in the second inverter can be larger than a width-to-length ratio of the n-channel field effect transistor of the first inverter. This improves the output power capacity.

The buffer can incorporate more than two inverters. An even number of inverters results in practically no phase-shift through the amplifier circuit. The first inverter, or the two or more inverters, can convert a signal that is supplied to the buffer into a rectangular signal which is output as the clock signal. The clock signal thus takes the form of a discrete-value, digital, signal.

The amplifier circuit can be designed in such a way as to provide a rectangular signal as a clock signal at its output.

In one embodiment, the amplifier circuit includes the first input, the second input, the comparator whose inputs form the first and second inputs to the amplifier circuit, the buffer that incorporates the first inverter and that couples the output of the comparator to the output of the amplifier circuit, and the output of the amplifier circuit.

In one embodiment, the integrator circuit incorporates a transconductance amplifier. At a first input, the transconductance amplifier is connected to the low-pass filter, while an output is connected to the second input of the amplifier circuit. A reference voltage can be fed to a second input of the transconductance amplifier. The reference voltage can be supplied to the circuit arrangement through an input of the circuit arrangement, or can be generated internally.

In an alternative embodiment, the integrator circuit incorporates an operational amplifier. An inverting input of the operational amplifier is connected to the low-pass filter. The reference voltage can be fed to a non-inverting input of the operational amplifier. An output of the operational amplifier is coupled to the second input of the amplifier circuit, and through a feedback capacitor to the inverting input of the operational amplifier.

The reference voltage can, be a constant or DC voltage. The reference voltage is free from any alternating voltage component. The integrator circuit incorporates a source of DC voltage to generate the reference voltage. The duty cycle depends on the reference voltage, as a value of the reference voltage is used to adjust the threshold value and thereby the duty cycle.

In a further development, the DC voltage source of the integrator circuit incorporates a voltage divider having a first and a second resistor that is connected between a supply voltage terminal and a ground potential terminal. A tap node in the voltage divider between the two resistors is connected to the second input of the transconductance amplifier or to the non-inverting input of the operational amplifier. The reference voltage can be made available at the tap node in the voltage divider. For a duty cycle of ½, the first and second resistors have the same value of resistance.

The first resistor and the second resistor of the voltage divider can be implemented as a resistor network with multiple taps. It is possible to switch between the taps in order to set the reference voltage to different values. The threshold output by the integrator circuit is developed depending on the reference voltage.

In an alternative embodiment, a switched-capacitor circuit can be provided instead of the voltage divider as part of the source of DC voltage. The switched-capacitor circuit comprises a first and a second switched capacitor, connected in series between a supply voltage terminal and a ground potential terminal, with a tap node between the first and the second switched capacitors. The tap node in the switched-capacitor circuit is connected to the second input of the transconductance amplifier or to the non-inverting input of the operational amplifier. The reference voltage made available at the tap node can, to a first approximation, be independent of a value of the first and a value of the second switched capacitors, and can be approximately half of the supply voltage. A holding capacitor connects the tap node in the switched-capacitor circuit to the reference potential terminal.

The low-pass filter that is connected between the output of the amplifier circuit and the input to the integrator circuit can be implemented as a first-order low-pass filter, and can incorporate a resistor and a capacitor. Alternatively, it can be realised as a higher-order low-pass filter. It can be implemented as a transconductance amplifier C-filter. A duty cycle of the clock signal can be accurately adjusted by means of a control circuit incorporating the amplifier circuit, the low-pass filter and the integrator circuit.

The oscillator which can be coupled in can be a quartz oscillator. The quartz oscillator can be realized as a Pierce circuit. Alternatively, the oscillator can be implemented as a ring oscillator. The oscillator can be implemented as a relaxation oscillator. The relaxation oscillator can be constructed as an LC oscillator or, as an RC oscillator.

The circuit arrangement can be implemented on a semiconductor chip. In an alternative embodiment, circuitry for an oscillator quartz can also be implemented on the semiconductor chip.

The circuit arrangement can be employed in a microprocessor circuit or a semiconductor memory component.

According an aspect to the invention, a method for the provision of a clock signal with an adjustable duty cycle incorporates the following steps: an oscillator signal is supplied to an amplifier circuit. The oscillator signal is processed in a way that depends on a threshold value. The processed oscillator signal is made available at the output as a clock signal with the duty cycle. A signal is derived from the duty cycle. The signal derived from the duty cycle is compared with an adjustable reference voltage, and the threshold value is made available according to the result of the comparison.

In this way it is possible to adjust the threshold value and thereby the duty cycle by means of a reference voltage.

The oscillator signal is processed depending on the threshold value by comparing the oscillator signal with the threshold value, amplifying the result of the comparison, and providing the amplified comparison results as the clock signal with the duty cycle. The clock signal with the duty cycle is adjusted depending on the oscillator signal and the threshold value. The clock signal here is a signal with discrete values.

BRIEF DESCRIPTION OF THE INVENTION

The invention is explained below in more detail with the aid of a number of examples of embodiments. Components performing the same function or having the same effect are given the same reference numbers. Inasmuch as parts of the circuit or components are the same, their description is not repeated in every one of the following figures.

Figure 2A:
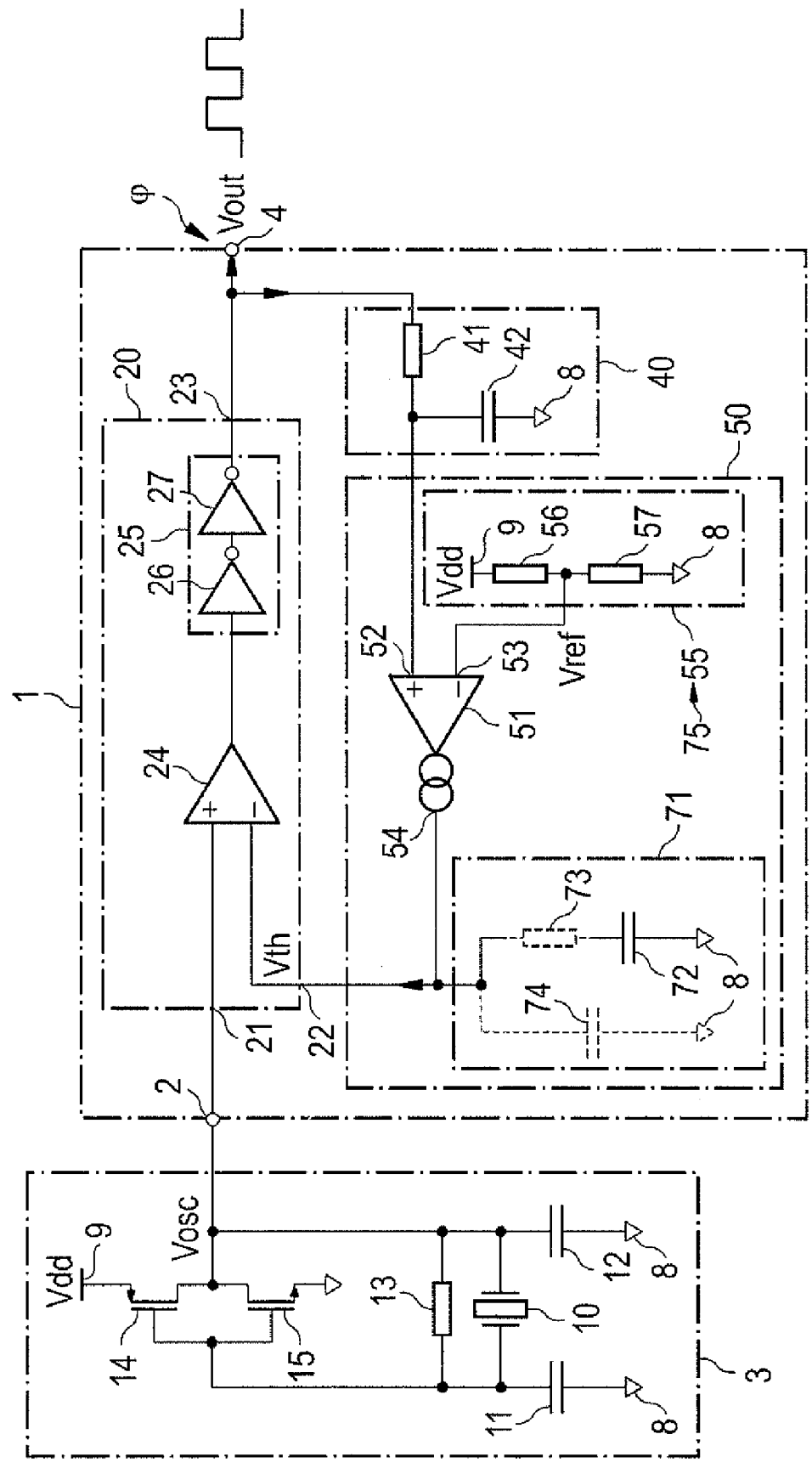
Figure 2B:
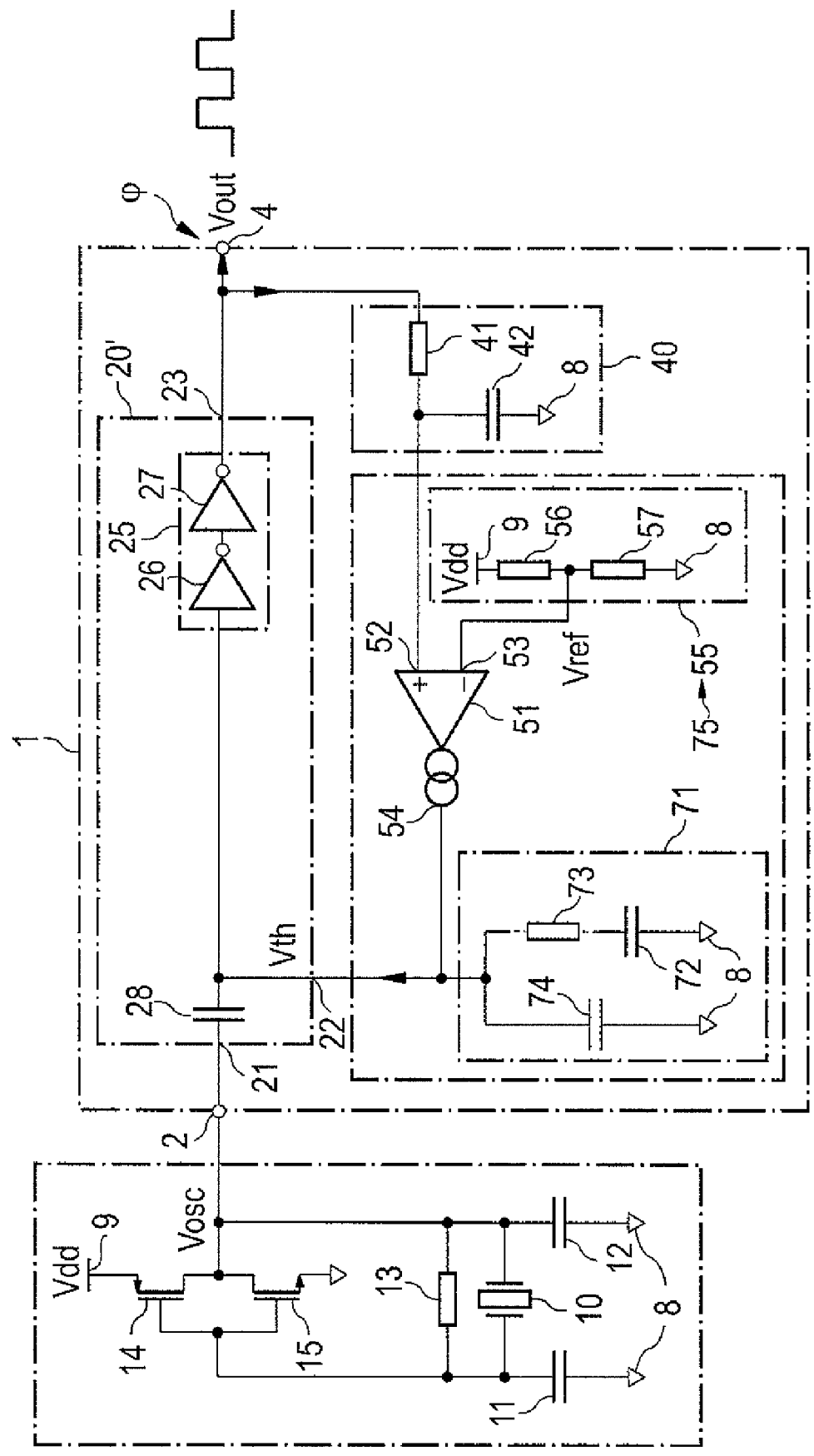
Figure 4A:
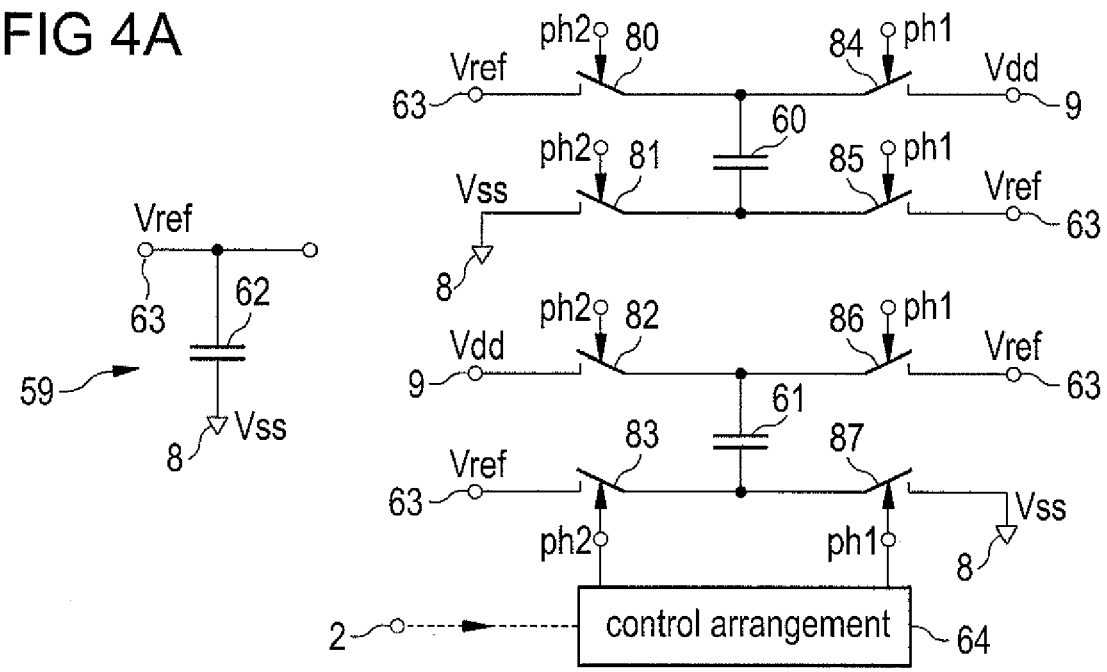
Figure 4B:
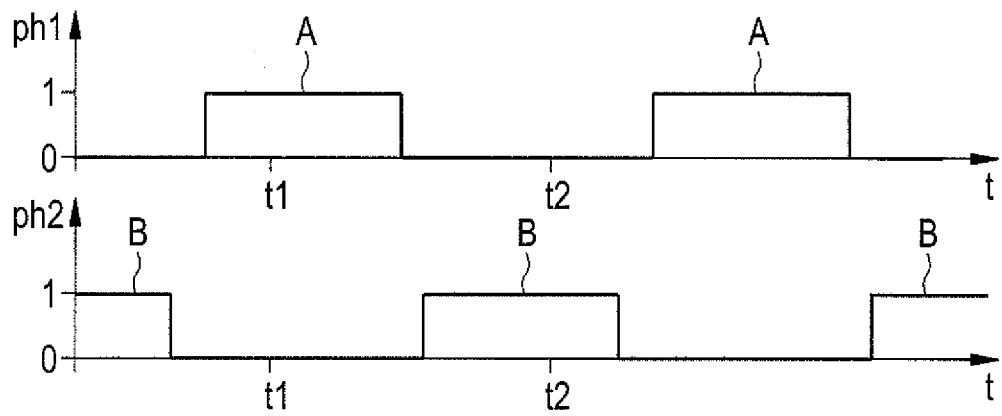
Figure 4C:
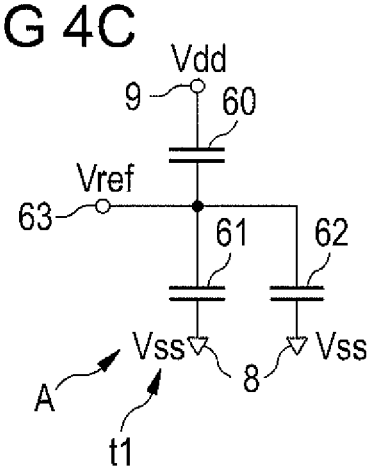
Figure 4D:
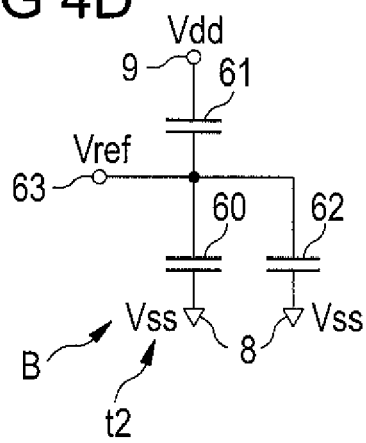
Figure 5:
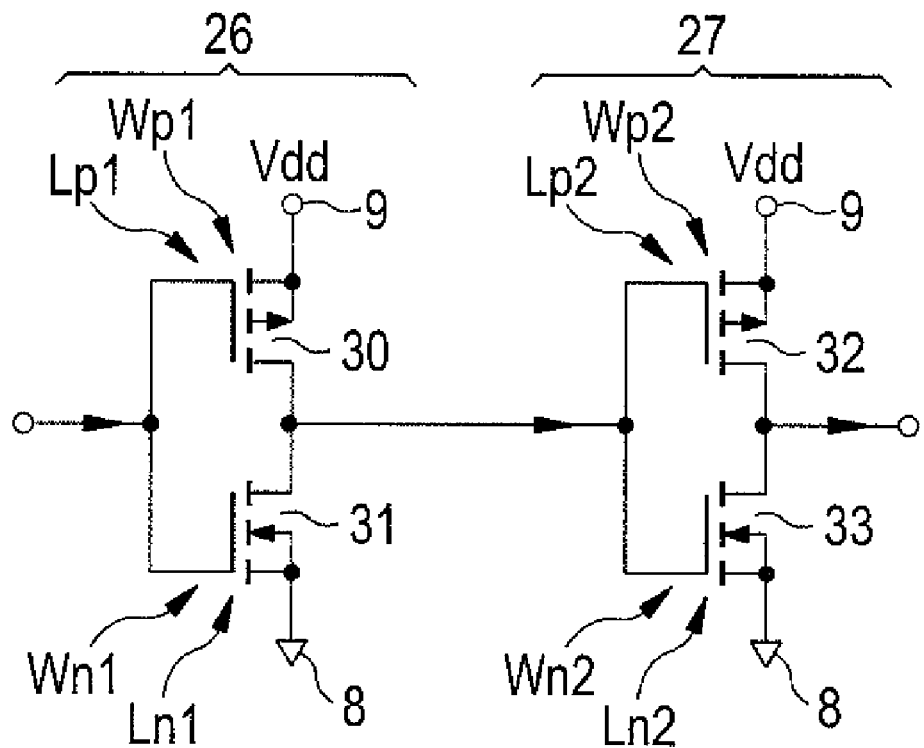
Figure 6:
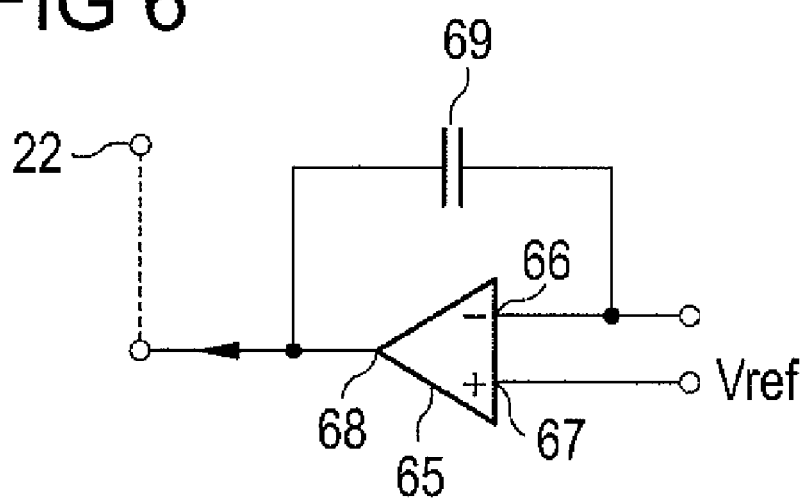
Figure 8:
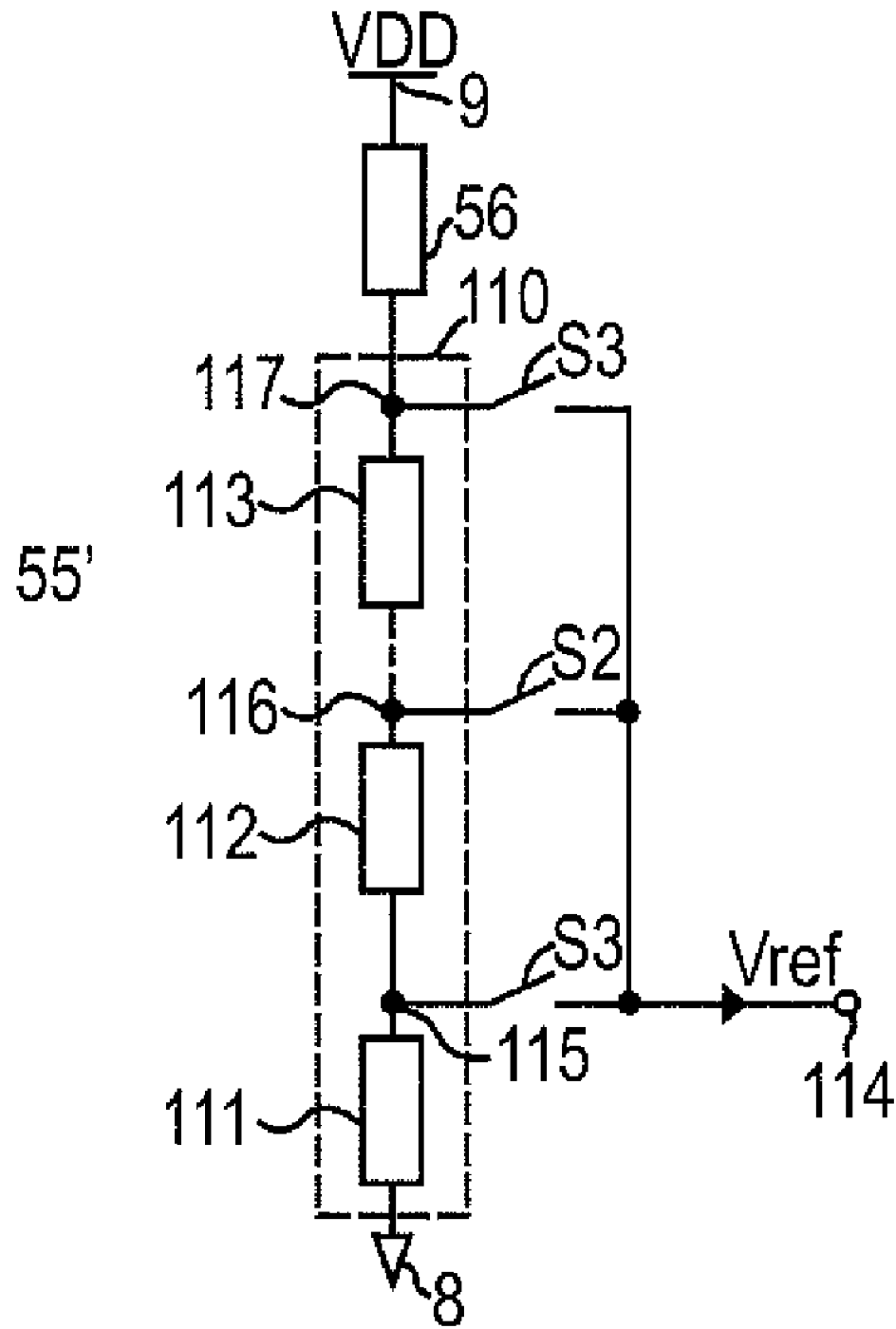

FIG. 1 illustrates an example of an embodiment of the circuit arrangement as a block diagram according to the invention, FIGS. 2A and 2B illustrate examples of embodiments of circuit arrangements according to the invention, FIG. 3 illustrates examples of signal curves against time for a circuit arrangement according to the invention, FIGS. 4A to 4D illustrate an example of an embodiment of a switched-capacitor circuit, FIG. 5 illustrates an example of an embodiment of a first and a second inverter, FIG. 6 illustrates an example of an embodiment of an operational amplifier, FIGS. 7A to 7B illustrate an example of an embodiment of a clocked transconductance amplifier, and FIG. 8 illustrates an example of an embodiment of a voltage divider.

DETAILED DESCRIPTION OF THE DRAWINGS

FIG. 1 illustrates an example of an embodiment of a circuit arrangement as a block diagram according to the invention. The circuit arrangement 1 comprises an amplifier circuit 20, a low-pass filter 40, and an integrator circuit 50. The circuit arrangement 1 moreover incorporates an input 2 that is connected to the oscillator 3. The circuit arrangement 1 also comprises an output 4 for delivering a clock signal Vout. A first input 21 of the amplifier circuit 20 is connected to the input 2 of the circuit arrangement 1, while an output 23 is connected to the output 4 of the circuit arrangement 1 as well as to an input of the low-pass filter 40. The input of the integrator circuit 50 is connected to the low-pass filter 40, while an output is connected to a second input 22 of the amplifier circuit. The amplifier circuit 20 incorporates a comparator 24, with inputs that are coupled to the first and second inputs 21, 22 of the integrator circuit is 20. The output of the comparator 24 is coupled to the output 23 of the amplifier circuit 20. A buffer 25 is connected between the comparator 24 and the output 23 of the amplifier circuit 20. The integrator circuit 50 comprises a transconductance amplifier 51, a source of DC voltage 75 that incorporates a voltage divider 55, and a loop filter 71. The input of the transconductance amplifier 51 is connected to the low-pass filter 40 and the voltage divider 55. At its output, the transconductance amplifier 51 is connected through the loop filter 71 to the second input 22 of the amplifier circuit 20.

At its output, the oscillator 3 provides an oscillator voltage Vosc that is fed to the first input 21 of the amplifier circuit 20, and thereby to the comparator 24. The clock signal Vout with a duty cycle φ is generated by means of the comparator 24 depending on the oscillator voltage Vosc and a threshold voltage Vth, which is present at the output of the integrator circuit 50. The clock signal Vout is filtered with the aid of the low-pass filter 40, as a result of which a signal with the clock ratio φ is obtained at the output of the low-pass filter 40. This signal is compared by means of the transconductance amplifier 51 to a reference voltage Vref that is available at the output of the voltage divider 55. The reference voltage Vref is a DC voltage. The loop filter 71 filters a signal that is available at the output of the transconductance amplifier 51, supplying it to the second input 22 of the circuit arrangement 1.

The duty cycle φ of the clock signal Vout is favourably adjusted in accordance with the reference voltage by means of the circuit arrangement 1. The amplifier circuit 20, the low-pass filter 40 and the integrator circuit 50 favourably comprise a control loop.

In an alternative embodiment, a switched-capacitor circuit 59 (see FIG. 4A) can take the place of the voltage divider 55 as a source of DC voltage 75 whose output provides the reference voltage Vref.

In an alternative embodiment, the transconductance amplifier 51 can be replaced by an operational amplifier 65 (see FIG. 6) with an inverting and a non-inverting input 66, 67 that are coupled to the output of the low-pass filter 40 and to a tap node in the voltage divider 55.

Alternatively, the buffer 25 can be omitted.

FIG. 2A illustrates an example of an embodiment of a circuit arrangement according to the invention, using a further development of the block diagram of FIG. 1. The oscillator 3 incorporates an oscillator quartz 10, a first terminal of which is connected through a first capacitor 11 and a second terminal of which is connected through a second capacitor 12 to a ground potential terminal 8. The first and second terminals of the oscillator quartz 10 are, moreover, connected to one another through a resistor 13. The first terminal of the oscillator quartz 10 is connected to a control terminal of an inverter 14, 15. The inverter incorporates a p-channel field effect transistor 14 and an n-channel field effect transistor 15 connected between a voltage supply terminal 9 and the ground potential terminal 8. A tap node between the controlled channels of the two transistors 14, 15 is connected to the second terminal of the oscillator quartz 10 and the input 2 of the circuit arrangement 1.

The low-pass filter 40 comprises a resistor 41 and a capacitor 42. The resistor 41 connects an input with an output of the low-pass filter 40, and the capacitor 42 connects the output of the low-pass filter 40 to the ground potential terminal 8. The voltage divider 55 that is comprised within the source of DC voltage 75 comprises a first and a second resistor 56, 57 that are connected between the voltage supply terminal 9 and the ground potential terminal 8. A tap node between the first and the second resistor 56, 57 is connected to the second input 53 of the transconductance amplifier 51. The output of the low-pass filter 40 is connected to a first input 52 of the transconductance amplifier 51. An output 54 of the transconductance amplifier 51 is connected to the second input 22 of the amplifier circuit 20. The loop filter 71 is implemented as an impedance between the output 54 of the transconductance amplifier 51 and the ground potential terminal 8. The loop filter 71 comprises a first capacitor 74 that is connected in parallel with a series circuit consisting of a second capacitor 72 and a first resistor 73, between the output 54 of the transconductance amplifier 51 and the ground potential terminal 8. The buffer 25 in the amplifier circuit 20 comprises a series connection of the first and a second inverter 26, 27.

The oscillator voltage Vosc is obtained at the output of the oscillator 3. The comparator 24 compares the oscillator voltage Vosc with the threshold value Vth that is made available at the output of the integrator circuit 50. The output of the comparator 24 provides the clock signal Vout with the duty cycle φ. The clock signal Vout is filtered by the low-pass filter 40, so that an approximately constant signal is present at the first input 52 of the transconductance amplifier 51, representing the duty cycle φ. A current is developed at the output 54 of the transconductance amplifier 51 that depends on the filtered signal and on the reference voltage Vref that can be obtained at the tap node between the first and second resistors 56, 57. The first input 52 of the transconductance amplifier 51 is here implemented as a non-inverting input, while the second input 53 is an inverting input. The output of the integrator circuit 50 provides the threshold value Vth depending on the current at the output 54 of the transconductance amplifier 51 and on a filter characteristic of the loop filter 71. The loop filter 71 is implemented as a low-pass filter. Only the amplifier circuit 20, which only exhibits a low phase delay, is incorporated in the forward branch of the control loop. The low-pass filter 40 and the loop filter 71 each generate a phase shift of up to 90 degrees. The combination of the integrator circuit 50 with the inverting input of the comparator 24 results in a further phase shift of approximately 180 degrees as a result of which the phase shift in the control loop reaches a total of 360 degrees.

FIG. 2B illustrates a further example of an embodiment of a circuit arrangement according to the invention. In contrast to the circuit arrangement according to FIG. 2A, the amplifier circuit 20' according to FIG. 2B incorporates a coupling capacitor 28 that connects the first input 21 of the amplifier circuit 20' with the input of the buffer 25. The second input 22 of the amplifier circuit 20' is also connected to the input of the buffer 25.

The threshold value Vth, which to a first approximation is a DC voltage, is thus supplied to the input of the first inverter 26. By means of the coupling capacitor 28, the oscillator voltage Vosc, or a proportion of the oscillator voltage Vosc, is superimposed onto this DC voltage. At the output, a signal can be accessed at the first inverter 26, primarily having either a low or a high-value, developed depending on the alternating signal that is coupled in and on the threshold value Vth. The first inverter 26 features an inverter threshold value for the transition from the low to the high level. If the total of the threshold value Vth and the alternating voltage signal that is coupled in exceeds the threshold value of the inverter, then the output of the first inverter 26 will generate a low value while the subsequent second inverter will output a high-value which is, at the same time, the value of the clock signal Vout.

An advantage of the amplifier circuit 20' according to FIG. 2B is that the implementation using a first and a second inverter 26, 27 requires a very small number of components.

It is an advantage of the circuit arrangement 1 according to FIG. 2B that the duty cycle φ of the clock signal Vout is almost independent of the inverter threshold of the first inverter 26 and of an inverter threshold of the second inverter 27. This is due, on the one hand, to the fact that the two inverters 26, 27 are connected in series and that therefore, for instance, an increased inverter threshold in the first inverter 26 is compensated for by an increased inverter threshold of the second inverter 27. On the other hand, the threshold value Vth is adjusted by means of the low-pass filter 40 and the integrator circuit 50 in such a way that the desired duty cycle φ is also achieved when the inverter threshold values deviate from a specified value.

FIG. 3 shows examples of signal curves against time t, such as might be found in a circuit arrangement 1 according to FIGS. 1 and 2A. If the oscillator voltage Vosc falls below the threshold value Vth, the clock signal Vout will have a low level. On the other hand, if the oscillator voltage Vosc exceeds the threshold value Vth, the clock signal Vout will have a high level. The high level will be present for the duration ton, while the low level will remain for the duration toff. The duration of the full period T is the sum of the on-time ton and the off-time toff. The duty cycle φ in this example is approximately 0.7.

A further threshold value Vth1 and a further clock signal Vout1 are shown as an example. The further on-time ton1 and the further off-time toff1 are the same, and the duty cycle φ thus has a value of 0.5.

FIGS. 4A to 4D show an example of an implementation of the source of DC voltage 75, comprising a switched-capacitor circuit 59, as can be employed in the place of the voltage divider 55 in the integrator circuit 50 according to FIG. 1, as well as according to FIGS. 2A and 2B.

FIG. 4A shows the switched-capacitor circuit 59 for provision of the reference voltage Vref, which is a fixed voltage. The switched-capacitor circuit 59 comprises a first and a second switched capacitor 60, 61, and a holding capacitor 62. The holding capacitor 62 is connected between the tap node 63 where the reference voltage Vref is provided and the ground potential terminal 8. The tap node 63 can, in one embodiment, be connected to the second input 53 of the transconductance amplifier 51. The first switched capacitor 60 is joined to a first electrode during a first phase A through a switch 84 to the supply voltage terminal 9, while a second electrode is joined through a transistor 85 to the tap node 63. The second switched capacitor 61 is, during the first phase A, connected to a first electrode through a switch 86 with the tap node 63, while a second electrode is connected through a switch 87 to the ground potential terminal 8. During a second phase B the first electrode of the first switched capacitor 60 is connected through a switch 80 to the tap node 63, while the second electrode is connected through a switch 81 to the ground potential terminal 8. Similarly, during the second phase B the first electrode of the second capacitor 61 is connected through a switch 82 to the supply potential terminal 9, while the second electrode is connected through a switch 83 to the tap node 63. In addition, FIG. 4A shows a control arrangement 64, the output of which is connected by means of switches 84 to 87 to supply a first phase signal ph1, and by means of switches 80 to 83 to supply a second phase signal ph2. The input of the control arrangements 64 is coupled to the input 2 of the circuit arrangement 1. This coupling is provided in order to generate the periodically occurring phase signals ph1, ph2 by means of the control arrangement 64.

In each case, one of the two switched capacitors 60, 61 is thus connected between the tap node 63 and the ground potential terminal 8, while in the other phase it is connected between the supply voltage terminal 9 and the tap node 63. One of the two switched capacitor 60, 61 therefore carries the difference between the supply voltage Vdd and the reference voltage Vref, while the second of the two switched capacitor is 60, 61 carries the reference voltage Vref. After a few clock cycles, a stable value is developed as the reference voltage Vref, being approximately half the value of the supply voltage Vdd. To a first approximation, this value of the reference voltage Vref is independent of the values of the capacitor is 60, 61, 62.

It is thus favourably possible to provide a reference voltage Vref with the value ½, corresponding to a duty cycle that is also ½. Favourably, the reference voltage available at the tap node 63 is, to a first approximation, independent of the frequency at which the first and the second switched capacitors 60, 61 are switched.

In one embodiment the switches 80 to 87 can be implemented as field-effect transistors.

FIG. 4B illustrates the first and second control signals ph1, ph2. A time t1 occurs during the first phase A, while the first phase signal ph1 has a logical high-value, while a time t2 occurs during the second phase B during which the phase signal ph2 has a logical high-value. Non-overlapping phases between the first phase A and the second phase B are provided. Other than this, the phases A, B alternate periodically. In this way a short-circuit between the supply voltage terminal 9 and the tap node 63, and a short-circuit between the tap node 63 and the ground potential terminal 8 are avoided.

FIG. 4C illustrates the switch conditions of the switched-capacitor circuit 59 at the time t1 during the first phase A. The first switched capacitor 60 couples the supply voltage Vdd to the reference voltage Vref, while the second switched capacitor 61 couples the reference voltage Vref to the ground potential Vss.

FIG. 4D illustrates the switch conditions of the switched-capacitor circuit 59 at the time t2 during the second phase B. The second switched capacitor 61 couples the supply voltage Vdd to the reference voltage Vref, while the first switched capacitor 60 couples the reference voltage Vref to the ground potential Vss.

FIG. 5 illustrates an example of an embodiment of a buffer 25, as may be employed in the amplifier circuit 20 of the circuit arrangement 1 according to FIGS. 1, 2A and 2B. The buffer 25 incorporates a first and a second inverter 26, 27. The first inverter comprises a p-channel field-effect transistor 30 and an n-channel field effect transistor 31 that are connected in series with one another between the supply voltage terminal 9 and the ground potential terminal 8. Correspondingly, the second inverter 27 incorporates a p-channel field-effect transistor 32 and an n-channel field-effect transistor 33 that are connected in series with one another between the supply voltage terminal 9 on the ground potential terminal 8. The four transistors 30 to 33 are implemented as enhancement mode transistors. The p-channel field-effect transistor 30 has a channel width Wp1 and a channel length Lp1. Correspondingly, the p-channel field-effect transistor 32 has a channel width Wp2 and a channel length Lp2, while the n-channel field-effect transistor 31 has a channel width Wn1 and a channel length Ln1 while the n-channel field-effect transistor has a channel width Wn2 and a channel length Ln2.

In one embodiment the channel widths Wp1, Wp2 and the channel lengths Lp1 and Lp2 of the p-channel field-effect transistor 30 and of the p-channel field effect transistor 32 have approximately the same values. In the same way, in this embodiment, the channel widths Wn1, Wn2 of the two n-channel field-effect transistors 31, 33 and the channel lengths Ln1, Ln2 of the two n-channel field-effect transistors 31, 33 have approximately the same values. According to this embodiment, the current capacities of the first inverter 26 and of the second inverter 27 are approximately the same.

In another embodiment, the ratio of the channel widths Wp2 to the channel length Lp2 of the p-channel field-effect transistor 32 is larger than the ratio of the channel length Wp1 and the channel length Lp1 of the p-channel field effect transistor 30. Correspondingly, a ratio of the channel width Wn2 to the channel length Ln2 of transistor 33 is larger than a ratio of the channel width Wn1 to the channel length Ln1 of transistor 31. According to this alternative embodiment, the current driving capacity of the second inverter 27 is greater than that of the first inverter 26. Favourably electrical loads that are connected to the output 4 of the circuit arrangement 1 can be driven better in this way.

FIG. 6 illustrates an operational amplifier 65, as can be employed instead of the transconductance amplifier 51 in the integrator circuit 50 according to FIGS. 1, 2A and 2B. An inverting input 66 of the operational amplifier 65 is connected through a feedback capacitor 69 to an output 68 of the operational amplifier 65. The output 68 of the operational amplifier 65 is coupled through the loop filter 71 that is not shown in FIG. 6 to the second input 22 of the amplifier circuit 20. The output of the low-pass filter 40 is connected to the inverting input 66. A non-inverting input 67 of the operational amplifier 65 is joined to the tap node 63 of the switched-capacitor circuit 59 or to the tap node between the two resistors 56, 57 of the voltage divider 55, in order to supply the reference voltage Vref to the operational amplifier 65. Because of the feedback capacitor 69, the operational amplifier is configured as an integrating amplifier.

In an alternative embodiment, the operational amplifier 65 is joined to the second input 22 of the amplifier circuit 20 without passing through the loop filter 71.

FIGS. 7A to 7B illustrate an example of an embodiment of a clocked transconductance amplifier 51, as can be employed in the integrator circuit 50 according to FIGS. 1, 2A and 2B. The transconductance amplifier 51 is configured for chopper operation.

FIG. 7A illustrates the principle of the transconductance amplifier 61 with the first and second inputs 52, 53 for the supply of a first and a second input voltage Vinn, Vinp. The transconductance amplifier 51 is connected to two outputs of a control arrangement 58 for the supply of a first and a second control signal $\Theta1$, $\Theta2$. An output voltage Vouto is available at the output of the transconductance amplifier 51.

FIG. 7B illustrates an example of an embodiment of the clocked transconductance amplifier 51. The transconductance amplifier 51 incorporates a current mirror 90, 91 and a further current mirror 92, 93, one terminal of which is connected to the supply voltage terminal 9. The transistor 90 is connected via transistor 100 to the ground potential terminal 8. In a similar way, transistor 93 is also connected through transistor 101 to the ground potential terminal 8. On the other hand, the transistor 91 is joined through a transistor 94 to a first terminal of a current source 97. The transistor 92 is also connected through a transistor 109 to the first terminal of the current source 97. A control terminal of transistor 94 is joined via a current source 96 to the tap node 108. A control terminal of transistor 95 is connected to the tap node 109. The tabs 108, 109 are coupled to the first and second inputs 52, 53 by means of switches 104 to 107 for the supply of the first and second input voltages Vinp, Vinn. A tap node between transistor 90 and transistor 100 is coupled via a switch 102 to the output 54 of the transconductance amplifier 51. Similarly, a tap node between transistor 93 and transistor 101 is coupled through a switch 103 to the output 54 of the transconductance amplifier 51. A control terminal of transistor 100 is connected to a control terminal of transistor 101. The two control terminals are coupled via a switch 98 to the tap node between the transistors 90, 100. Similarly the two control terminals are coupled through a switch 99 to the tap node between the transistors 93, 101.

While the first control signal $\Theta1$ adopts a high level, the first input voltage Vinp is fed by means of switch 104 to the tap node 108, and the second input voltage Vinn is fed through switch 107 to the tap node 109. In contrast, while the second control signal $\Theta2$ adopts a high level, the first input voltage Vinp is fed through switch 105 to the tap node 109, while the second input voltage Vinn is fed through switch 106 to the tap node 108.

While the first control signal $\Theta1$ adopts the high level, switches 99, 102 are also in a closed operating state. While the second control signal $\Theta2$ has a high level, switches 98, 103 are in a closed operating state. In this way, the terminals at the input and output are switched in such a way that, after smoothing by a low-pass filter that is connected to output 54, a threshold value Uth which, to a first approximation, is independent of the offset of the transconductance amplifier 51, is found at the output of the integrator circuit 50.

FIG. 8 shows an exemplary embodiment of a voltage divider comprising a network of resistors. The voltage divider 55' can be used as a direct current voltage source, abbreviated DC voltage source. The voltage divider 55' can be inserted into the circuits of FIGS. 1, 2A and 2B instead of the voltage divider 55. The voltage divider 55, comprises the first resistor 56 and a resistor network 110. The first resistor 56 and the resistor network 110 are connected in series. They are arranged between the power supply terminal 9 and the reference potential terminal 8. A first terminal of the first resistor 56 is connected to the power supply terminal 9. A second terminal of the first resistor 56 is connected to a first terminal of the resistor network 110. A second terminal of the resistor network 110 is connected to the reference potential terminal 8. The resistor network 110 comprises a first and a second network resistor 111, 112. The first and the second network resistors 111, 112 are connected in series. A terminal of the first network resistor 111 is connected to the reference potential terminal 8. A terminal of the second network resistor 112 is coupled to the first resistor 56. A tap 115 between the first and the second network resistor 111, 112 is connected to an output terminal 114 of the voltage divider 55 via a first switch S1. A tap 116 between the second network resistor 112 and the first resistor 56 is connected to the output terminal 114 via a second switch S2.

Furthermore, the resistor network 110 comprises a third network resistor 113 which is connected in series to the first and the second network resistors 111, 112. The third network resistor 113 is arranged between the second network resistor 112 and the first resistor 56. A tap 117 between the third network resistor 113 and the first resistor 56 is connected to the output terminal 114 via a third switch S3. The output terminal 114 is connected to the second input 53 of the transconductance amplifier 51 of FIGS. 1, 2A, 2B, 7A, 7B or to the non-inverting input 67 of the operational amplifier 65 of FIG. 6.

The voltage divider 55' comprises more than two resistors. Therefore, the voltage divider 55' is adapted to provide more than one value of the reference voltage Vref. During the operation of circuit arrangement, one of the three switches S1, S2, S3 is closed so that the voltage at the corresponding tap 115, 116, 117 is provided as a reference voltage Vref at the output terminal 114 of the voltage divider 55'. As the first switch S1 is closed, the reference voltage Vref has a first value. Correspondingly, if the second switch S2 is closed the reference voltage obtains a second value. Similarly, if the third switch S3 is closed the reference voltage Vref has a third value.

In the resistor network 110 at least one of the switches S1, S2, S3 is closed. Further values of the reference voltage Vref can be generated if more than one switch S1, S2, S3 is closed. For example, the first and the second switch S1, S2 are closed. In this case, the second network resistor 112 does not influence the value of the reference voltage Vref and only the first resistor 56 as well as the first and the third network resistor 111, 113 influence the value of the reference voltage Vref.

It is an advantage of the voltage divider 55' that different values of the reference voltage Vref can be selected. Thus, the output voltage Vout of the circuit arrangement can show different duty cycles. The resistor network 110 is adapted as a switchable resistor network for providing different values of the reference voltage Vref.

In an alternative embodiment which is not shown the resistor network 110 comprises more than three network resistors.

In an alternative embodiment which is not shown the first resistor 56 is replaced by a further resistor network which is designed like the resistor network 110.

A circuit arrangement according to the invention for the provision of a clock signal with an adjustable duty cycle comprises an amplifier circuit, a low-pass filter and an integrator circuit. A first input of the amplifier circuit is connected to an input of the circuit arrangement. An output of the amplifier circuit is coupled to an output of the circuit arrangement. The input of the low-pass filter is connected to the output of the amplifier circuit, while its output is connected to the integrator circuit. The output of the integrator circuit, in turn, is connected to a second input of the amplifier circuit.

The input of the circuit arrangement is used to connect an oscillator. An oscillator voltage is fed to the input of the circuit arrangement. A clock signal with a duty cycle can be accessed at the output of the circuit arrangement. A signal present at the output of the amplifier circuit is supplied to the low-pass filter. A signal that can be accessed at the output of the low-pass filter is supplied to the integrator circuit. The integrator circuit is designed to deliver a specifiable threshold value for controlling the duty cycle. This threshold value is fed to the second input of the amplifier circuit. The amplifier circuit provides a signal at its output whose value depends on the oscillator signal and on the threshold value.

The signal generated by the amplifier circuit is thus fed back through the low-pass filter and the integrator circuit to the second input of the amplifier circuit. The low-pass filter generates a signal that, to a first approximation, has a constant value that corresponds to the duty cycle. Due to the feedback, any change in the duty cycle arising, for instance, as a result of a disturbance in the oscillator voltage or of an electrical load that might be coupled to the output is counteracted, so that the duty cycle prior to the interference is again achieved.

A threshold value of the amplifier circuit can be adjusted by means of the threshold value generated by the integrator circuit. An advantage of the circuit arrangement is that a phase of the clock signal is almost identical to a phase of the oscillator signal.

In a further development, the amplifier circuit incorporates a comparator, a first and a second input of which are connected respectively to the first and second inputs of the amplifier circuit. An output of the comparator can be connected to the output of the amplifier circuit. A buffer can be provided to connect the output of the comparator to the output of the amplifier circuit.

In an alternative further development, the amplifier circuit incorporates a buffer with an output that is connected by means of a coupling capacitor to the first input of the amplifier circuit. At its input, the buffer, furthermore is connected to the second input of the amplifier circuit, while its output is connected to the output of the amplifier circuit.

The buffer can incorporate an inverter. Alternatively, the buffer can comprise a first inverter and a second inverter, whereby the second inverter follows the first inverter. The output current that can be drawn from the second inverter here can be larger than the output current of the first inverter. In one embodiment of this further development, the width-to-length ratio of the p-channel field-effect transistor in the second inverter can be larger than the width-to-length ratio of the p-channel field effect transistor of the first inverter and, correspondingly, a width-to-length ratio of the n-channel field-effect transistor in the second inverter can be larger than a width-to-length ratio of the n-channel field effect transistor of the first inverter. This improves the output power capacity.

The buffer can incorporate more than two inverters. An even number of inverters results in practically no phase-shift through the amplifier circuit. The first inverter, or the two or more inverters, can convert a signal that is supplied to the buffer into a rectangular signal which is output as the clock signal. The clock signal thus takes the form of a discrete-value, digital, signal.

The amplifier circuit can be designed in such a way as to provide a rectangular signal as a clock signal at its output.

In one favourable embodiment, the amplifier circuit includes the first input, the second input, the comparator whose inputs form the first and second inputs to the amplifier circuit, the buffer that incorporates the first inverter and that couples the output of the comparator to the output of the amplifier circuit, and the output of the amplifier circuit.

In one embodiment, the integrator circuit incorporates a transconductance amplifier. At a first input, the transconductance amplifier is connected to the low-pass filter, while an output is connected to the second input of the amplifier circuit. A reference voltage can be fed to a second input of the transconductance amplifier. The reference voltage can be supplied to the circuit arrangement through an input of the circuit arrangement, or can be generated internally.

In an alternative embodiment, the integrator circuit incorporates an operational amplifier. An inverting input of the operational amplifier is connected to the low-pass filter. The reference voltage can be fed to a non-inverting input of the operational amplifier. An output of the operational amplifier is coupled to the second input of the amplifier circuit, and through a feedback capacitor to the inverting input of the operational amplifier.

The reference voltage can, be a constant or DC voltage. The reference voltage is free from any alternating voltage component. The integrator circuit incorporates a source of DC voltage to generate the reference voltage. The duty cycle depends on the reference voltage, as a value of the reference voltage is used to adjust the threshold value and thereby the duty cycle.

In a further development, the DC voltage source of the integrator circuit incorporates a voltage divider having a first and a second resistor that is connected between a supply voltage terminal and a ground potential terminal. A tap node in the voltage divider between the two resistors is connected to the second input of the transconductance amplifier or to the non-inverting input of the operational amplifier. The reference voltage can be made available at the tap node in the voltage divider. For a duty cycle of ½, the first and second resistors have the same value of resistance.

The first resistor and the second resistor of the voltage divider can be implemented as a resistor network with multiple taps. It is possible to switch between the taps in order to set the reference voltage to different values. The threshold output by the integrator circuit is developed depending on the reference voltage.

In an alternative embodiment, a switched-capacitor circuit can be provided instead of the voltage divider as part of the source of DC voltage. The switched-capacitor circuit comprises a first and a second switched capacitor, connected in series between a supply voltage terminal and a ground potential terminal, with a tap node between the first and the second switched capacitors. The tap node in the switched-capacitor circuit is connected to the second input of the transconductance amplifier or to the non-inverting input of the operational amplifier. The reference voltage made available at the tap node can, to a first approximation, be independent of a value of the first and a value of the second switched capacitors, and can be approximately half of the supply voltage. A holding capacitor connects the tap node in the switched-capacitor circuit to the reference potential terminal.

The low-pass filter that is connected between the output of the amplifier circuit and the input to the integrator circuit can be implemented as a first-order low-pass filter, and can incorporate a resistor and a capacitor. Alternatively, it can be realised as a higher-order low-pass filter. It can be implemented as a transconductance amplifier C-filter. A duty cycle of the clock signal can be accurately adjusted by means of a control circuit incorporating the amplifier circuit, the low-pass filter and the integrator circuit.

The oscillator which can be coupled in can be a quartz oscillator. The quartz oscillator can be realized as a Pierce circuit. Alternatively, the oscillator can be implemented as a ring oscillator. The oscillator can be implemented as a relaxation oscillator. The relaxation oscillator can be constructed as an LC oscillator or, as an RC oscillator.

The circuit arrangement can be implemented on a semiconductor chip. In an alternative embodiment, circuitry for an oscillator quartz can also be implemented on the semiconductor chip.

The circuit arrangement can be employed in a microprocessor circuit or a semiconductor memory component.

According to the invention, a method for the provision of a clock signal with an adjustable duty cycle incorporates the following steps: an oscillator signal is supplied to an amplifier circuit. The oscillator signal is processed in a way that depends on a threshold value. The processed oscillator signal is made available at the output as a clock signal with the duty cycle. A signal is derived from the duty cycle. The signal derived from the duty cycle is compared with an adjustable reference voltage, and the threshold value is made available according to the result of the comparison.

In this way it is possible to adjust the threshold value and thereby the duty cycle by means of a reference voltage.

The oscillator signal is processed depending on the threshold value by comparing the oscillator signal with the threshold value, amplifying the result of the comparison, and providing the amplified comparison results as the clock signal with the duty cycle. The clock signal with the duty cycle is adjusted depending on the oscillator signal and the threshold value. The clock signal here is a signal with discrete values.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A circuit arrangement for the provision of a clock signal with an adjustable cycle comprising:
    an input for connecting an oscillator;
    an amplifier circuit
        with a first input that is coupled to the input of the circuit arrangement;
        with a second input;
        with a comparator whose inputs constitute the first and second input of the amplifier circuit; and
        with a buffer that comprises at least a first inverter and couples an output of the comparator to an output of the amplifier circuit;
    an output which is connected to the output of the amplifier circuit and at which a clock signal with a duty cycle is available;
    a low-pass filter, an input of which is connected to the output of the amplifier circuit; and
    an integrator circuit, an input of which is connected to the low-pass filter and an output of which is connected to the second input of the amplifier circuit for the provision of an adjustable threshold value for controlling the duty cycle (f);
    wherein the integrator circuit comprises a loop filter that is connected to the output of the integrator circuit; and
    wherein the loop filter comprises a first capacitor that connects the output of the integrator circuit to the ground potential terminal and a series circuit comprising a resistor and a second capacitor that connect the output of the integrator circuit to the ground potential terminal.

2. The circuit arrangement according to claim 1, wherein the buffer comprises a second inverter, wherein the second inverter follows the first inverter, and the current driving capacity of the second inverter is greater than the current driving capacity of the first inverter.

3. The circuit arrangement according to claim 1, wherein the integrator circuit comprises a transconductance amplifier having:
a first input coupled to the low-pass filter,
a second input adapted to be coupled to a reference voltage, and
an output coupled to the second input of the amplifier circuit.

4. The circuit arrangement according to claim 3, wherein the transconductance amplifier is configured for chopper operation.

5. The circuit arrangement according to claim 1, wherein the integrator circuit comprises an operational amplifier having
an inverting input coupled to the low-pass filter,
a non-inverting input adapted to be coupled to a reference voltage, and
an output coupled to the second input of the amplifier circuit and through a feedback capacitor to the inverting input.

6. The circuit arrangement according to claim 3, wherein the integrator circuit comprises a source of DC voltage that includes a tap node where the reference voltage is accessible.

7. The circuit arrangement according to claim 6, wherein the source of DC voltage in the integrator circuit comprises a voltage divider having a first and a second resistor that is coupled between the supply voltage terminal and a ground potential terminal, and which comprises a tap node at which the reference voltage is accessible and which is coupled to the second input of the transconductance amplifier or to the non-inverting input of the operational amplifier.

8. The circuit arrangement according to claim 7, wherein the first resistor comprises a resistor network having several taps between which it is possible to switch, and/or the second resistor comprises a network of resistors with several taps between which it is possible to switch, in such a way that the reference voltage can be switched between a variety of values in order to adjust the threshold value.

9. The circuit arrangement according to claim 6, wherein the source of DC voltage in the integrator circuit comprises a switched-capacitor circuit having a first and a second switched capacitor and with a tap node that is coupled to the second input of the transconductance amplifier or with the non-inverting input of the operational amplifier and, via a holding capacitor to the ground potential terminal, and where the reference voltage is accessible.

10. The circuit arrangement according to claim 9, wherein
during a first phase, the first switched capacitor is coupled between a supply voltage terminal and the tap node while the second switched capacitor is coupled between the tap node and the ground potential terminal, and
during a second phase the first switched capacitor is coupled between the tap node and the ground potential terminal, while the second switched capacitor is coupled between the supply voltage terminal and the tap node, and where the first and second phases alternate periodically.

11. The circuit arrangement according to claim 1, wherein the low-pass filter comprises a resistor that connects an input of the low-pass filter to an output of the low-pass filter, and a capacitor that connects the output of the low-pass filter to the ground potential terminal.

12. A method for providing a clock signal with an adjustable duty cycle, comprising the steps of:
supplying an oscillator signal;
comparing the oscillator signal with a threshold value, amplifying the result of the comparison and providing the amplified result of the comparison as the clock signal with the duty cycle;
providing a signal derived from the duty cycle; and
comparing the signal derived from the duty cycle with an adjustable reference voltage and providing the threshold value in accordance with the result of the comparison;
wherein an integrator circuit comprises a transconductance amplifier and a loop filter, the integrator circuit provides at its output the threshold value depending on a current at an output of the transconductance amplifier and on a filter characteristic of the loop filter, and where the loop filter comprises a first capacitor that is connected in parallel to a series circuit comprising a second capacitor and a first resistor between the output of the transconductance amplifier and a ground potential terminal.

13. A circuit arrangement for the provision of a clock signal with an adjustable duty cycle, comprising:
an input for the connection of an oscillator;
an amplifier circuit comprising:
a first input that is coupled to the input of the circuit arrangement,
a second input,
a comparator whose inputs form the first and second inputs of the amplifier circuit, and
a buffer that comprises at least a first inverter and which couples an output of the comparator to an output of the amplifier circuit;
an output that is coupled to the output of the amplifier circuit and where a clock signal with a duty cycle can be accessed;
a low-pass filter, an input of which is coupled to the output of the amplifier circuit; and
an integrator circuit, an input of which is coupled to the low-pass filter and an output of which is coupled to the second input of the amplifier circuit to deliver an adjustable threshold value to control the duty cycle.

14. The circuit arrangement according to claim 13, wherein the buffer comprises a second inverter, and wherein the second inverter follows the first inverter, and wherein the current driving capability of the second inverter is larger than the current driving capability of the first inverter.

15. The circuit arrangement according to claim 13, wherein the integrator circuit incorporates a transconductance amplifier comprising:
a first input coupled to the low-pass filter;
a second input adapted to be coupled to a reference voltage, and
an output coupled to the second input of the amplifier circuit.

16. The circuit arrangement according to claim 13, wherein the integrator circuit comprises an operational amplifier comprising:
an inverting input coupled to the low-pass filter,
a non-inverting input adapted to be coupled to a reference voltage, and
an output coupled to the second input of the amplifier circuit as well as, through a feedback capacitor to the inverting input.

17. The circuit arrangement according to claim 15, wherein the integrator circuit comprises a source of DC voltage that has a tap node at which the reference voltage is accessible.

18. The circuit arrangement according to claim 17, wherein the source of DC voltage in the integrator circuit comprises a voltage divider having a first and a second resistor and being coupled between a supply voltage terminal and a ground potential terminal, having a tap node at which the reference voltage is accessible, and being coupled to the second input of the transconductance amplifier or to the non-inverting input of the operational amplifier.

19. The circuit arrangement according to claim 17, wherein the source of DC voltage in the integrator circuit comprises a switched-capacitor circuit having a first and a second switched capacitor and with a tap node coupled to the second input of the transconductance amplifier or to the non-inverting input of the operational amplifier and through a holding capacitor to a ground potential terminal, and where the reference voltage is accessible.

20. The circuit arrangement according to claim 19, wherein
during a first phase the first switched capacitor is coupled between a supply voltage terminal and the tap node while the second switched capacitor is coupled between the tap node and the ground potential terminal, and
during a second phase the first switched capacitor is coupled between the tap node and the ground potential terminal while the second switched capacitor is coupled between the supply voltage terminal and the tap node, and where the first and second phases alternate periodically.

* * * * *